(12) United States Patent
Park

(10) Patent No.: US 7,307,024 B2
(45) Date of Patent: Dec. 11, 2007

(54) FLASH MEMORY AND FABRICATION METHOD THEREOF

(75) Inventor: Geon-Ook Park, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 454 days.

(21) Appl. No.: 10/747,311

(22) Filed: Dec. 30, 2003

(65) Prior Publication Data

US 2004/0214433 A1    Oct. 28, 2004

(30) Foreign Application Priority Data

Jan. 30, 2003    (KR) .................. 10-2003-0006343

(51) Int. Cl.
*H01L 21/302* (2006.01)
(52) U.S. Cl. ............ 438/703; 438/383; 438/299; 257/331; 257/59; 257/368
(58) Field of Classification Search ........... 438/703
See application file for complete search history.

(56) References Cited

U.S. PATENT DOCUMENTS 5,200,351 A * 4/1993 Hadjizadeh-Amini ...... 438/305
5,877,523 A * 3/1999 Liang et al. ............... 257/315
6,069,382 A 5/2000 Rahim
6,153,494 A 11/2000 Hsieh et al.
6,261,905 B1 7/2001 Chen et al.
6,501,125 B2 12/2002 Kobayashi
6,512,262 B2 1/2003 Watanabe
6,559,501 B2 * 5/2003 Sung et al. ............... 257/316
6,579,761 B1 6/2003 Hsieh
6,590,253 B2 * 7/2003 Chen ......................... 257/314

OTHER PUBLICATIONS

Huang et al. (IEEE Transactions on Electron Devices, vol. 48, No. 5, May 2001).*

* cited by examiner

*Primary Examiner*—Nadine G. Norton
*Assistant Examiner*—Patricia A. George
(74) *Attorney, Agent, or Firm*—Sherr & Nourse, PLLC

(57) ABSTRACT

A flash memory and a fabrication method thereof, which is capable of improving a whole capacitance of the flash memory by forming a tunneling oxide and a floating gate only in a portion where injection of electrons occurs. A flash memory wherein a tunneling oxide and a floating gate are formed only in a portion where injection of electrons occurs and a gate insulation film is formed on a semiconductor substrate between two portions of the tunneling oxide.

4 Claims, 5 Drawing Sheets

FLASH MEMORY AND FABRICATION METHOD THEREOF

PRIORITY

This application claims the priority of an application Ser. No. 10-2003-000643, filed in the Republic of Korea, on Jan. 30$^{th}$, 2003.

BACKGROUND OF THE INVENTION (a) Field of the Invention

The present invention relates to a flash memory and a fabrication method thereof, and more particularly to a flash memory where a tunneling oxide and a floating gate are formed only in a portion in which electrons are injected.

(b) Description of the Related Art

In general, a flash memory, which is a memory device designed to realize merits of EPROM (erasable programmable read only memory) and EEPROM (electrically erasable programmable read only memory) simultaneously, aims at electrical programming and erasure of data and low production cost in aspects of simplicity of fabrication processes, small-sizing of chips, etc.

In addition, although the flash memory is a nonvolatile semiconductor memory where data are not erased even when a power turns off, since it has the property of ROM (random access memory) in that programming and erasure of information is easily achieved in a system, it has been used for a memory device substituting a memory card or a hard disk of an office automation equipment.

The programming of data in the flash memory is achieved by injection of hot electrons. In other words, when hot electrons are generated in a channel by a potential difference between a source and a drain, some of the hot electrons, which obtain more than 3.1 eV, which is a potential barrier between a polycrystalline silicon layer constituting a gate and an oxide film, move to and are stored in a floating gate by a high electric field applied across a control gate.

Therefore, the flash memory is designed such that the hot electrons are generated, although a general MOS device is designed such that generation of the hot electrons is suppressed because they are the cause of deterioration of the device.

Conventional techniques for the flash memory are disclosed in U.P. Pat. Nos. 6,579,761, 6,512,262, 6,501,125, 6,261,905, 6,153,494, and 6,069,382.

Hereinafter, a conventional flash memory will be in brief described with reference to FIGS. 1a to 2.

FIGS. 1a and 1b are sectional views showing a conventional method for fabricating the flash memory, and FIG. 2 is a top view of the conventional flash memory shown in FIG. 1b.

First, as shown in FIG. 1a, a tunneling oxide 2 is formed at a thickness of an order of 100 Å on a semiconductor substrate 1, a floating gate 3 made of polycrystalline silicon is formed at a thickness of an order of 2,500 Å on the tunneling oxide 2, and then a gate insulation film 4 having an oxide/nitride/oxide (ONO; hereinafter referred to as "ONO") structure is formed on the floating gate 3.

In order to form the gate insulation film 4 having the ONO structure, a lower oxide film is formed on the floating gate 3 by thermally oxidizing a polycrystalline silicon layer of the floating gate 3, a silicon nitride film is formed on the lower oxide film by using a thermal process, and then an upper oxide film is formed on the silicon nitride film by using a thermal process and is annealed.

Subsequently, a control gate 5 to function as an actual electrode is formed by depositing a polycrystalline silicon layer at a thickness of an order of 2,500 Å on the gate insulation film 4.

Next, as shown in FIGS. 1b and 2, after the control gate 5, the gate insulation film 4, the floating gate 3, and the tunneling oxide 2 are selectively etched, leaving a predetermined width, and a silicon nitride film is deposited at a thickness of an order of 2,000 Å on the entire top surface, a side wall 6 is formed by blanket etch without using a separate mask.

Subsequently, a source 7 and a drain 8 are formed by injecting impurity ions into the semiconductor substrate 1.

When a positive voltage of certain conditions for programming of data in the flash memory having the structure as described above is applied to the gate, the hot electrons are injected into the floating gate as they move through a channel formed in the semiconductor substrate 1 under the tunneling oxide 2 and are accelerated by an electric field.

At this time, just as the injection of the hot electrons into the floating gate is shown by an arrow in FIG. 1b, the hot electrons are injected into not the entire surface of the floating gate but a point close to a drain 8, which shows the greatest potential difference, so called "pinch-off point".

Similarly, when a negative voltage of certain conditions for erasure of data is applied to the gate, the electrons stored in the floating gate are injected into a source 7 by a potential difference.

At this time, as shown by the arrow in FIG. 1b, the electrons are injected into not the entire surface of the tunneling oxide but a point close to the source 7, which shows the greatest potential difference.

Therefore, in the above-described conventional flash memory, a whole capacitance is reduced by the tunneling oxide in an unnecessary portion where the injection of electrons does not occurs.

Since an application voltage has to be increased in order to compensate for the reduced capacitance, power consumption is increased. In addition, heat is generated due to the increase of the application voltage, which results in reduction of life of devices.

SUMMARY OF THE INVENTION

In considerations of the above problems, it is an object of the present invention to improve a whole capacitance of a flash memory.

It is another object of the present invention to form a tunneling oxide and a floating gate only in a portion where injection of electrons occurs.

To achieve the objects, there is provided a flash memory wherein a tunneling oxide and a floating gate are formed only in a portion where injection of electrons occurs and a gate insulation film is formed on a semiconductor substrate between two portions of the tunneling oxide.

According to an aspect of the present invention, a method for fabricating a flash memory comprises the steps of: forming a tunneling oxide on a semiconductor substrate; forming a floating gate by depositing a first polycrystalline silicon on the tunneling oxide; selectively etching the floating gate and the tunneling oxide such that two regions, each having a predetermined width on an active area of the semiconductor substrate, separated from each other by a predetermined interval, and connected to each other in a field area of the semiconductor substrate, are left; forming a gate insulation film on the entire surface of the semiconductor substrate including the floating gate; forming a control gate by depositing a second polycrystalline silicon on the gate insulation film; exposing an outside wall of the floating gate by etching the gate insulation film formed in the outside wall of the floating gate while selectively etching the control gate and the gate insulation film such that the control gate and the gate insulation film are left by a predetermined width; forming a nitride film on the entire top surface of the semiconductor substrate and then forming a side wall on outside walls of the control gate, the gate insulation film, the floating gate, and the tunneling oxide by blanket-etching the nitride film; and forming a source and drain region by injecting impurities into the semiconductor to the outside of the floating gate.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A flash memory and a method for fabricating the same according to a preferred embodiment of the present invention will now be described in detail with reference to the accompanying drawings.

Figure 1A:
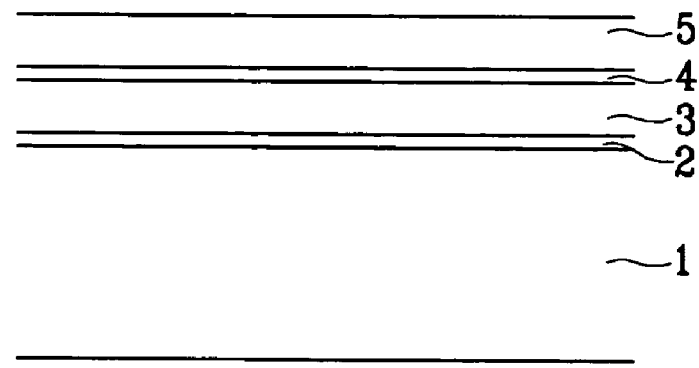
FIGS. 1a and 1b are sectional views showing a conventional method for fabricating the flash memory.
Figure 1B:
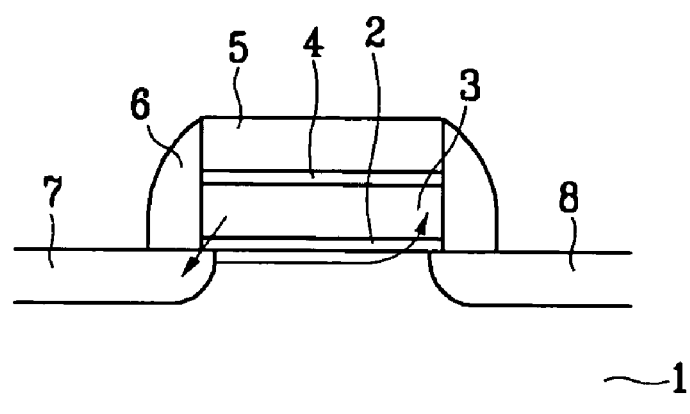
Figure 2:
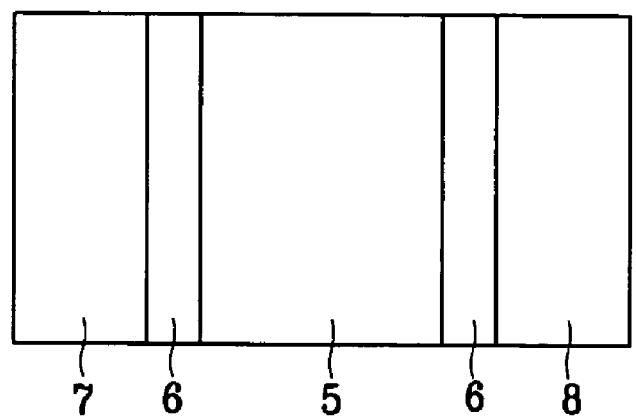
FIG. 2 is a top view of the conventional flash memory shown in FIG. 1b.
Figure 3A:
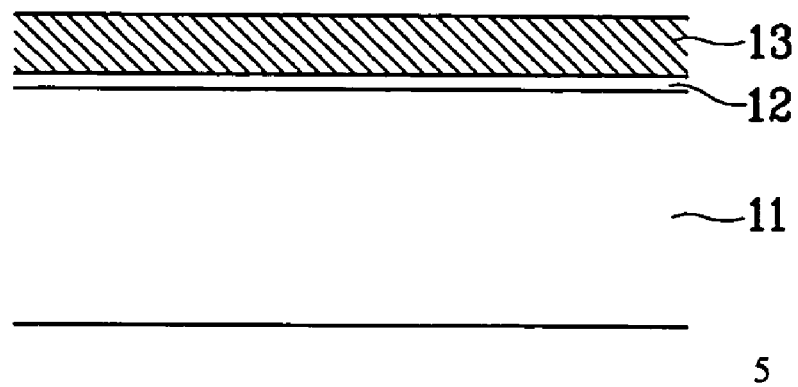
FIGS. 3a to 3f are sectional views showing a method for fabricating a flash memory according to the present invention.
Figure 3B:
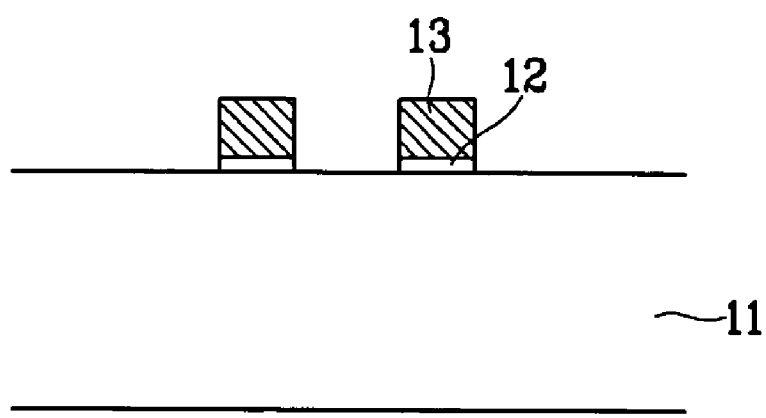
Figure 3C:
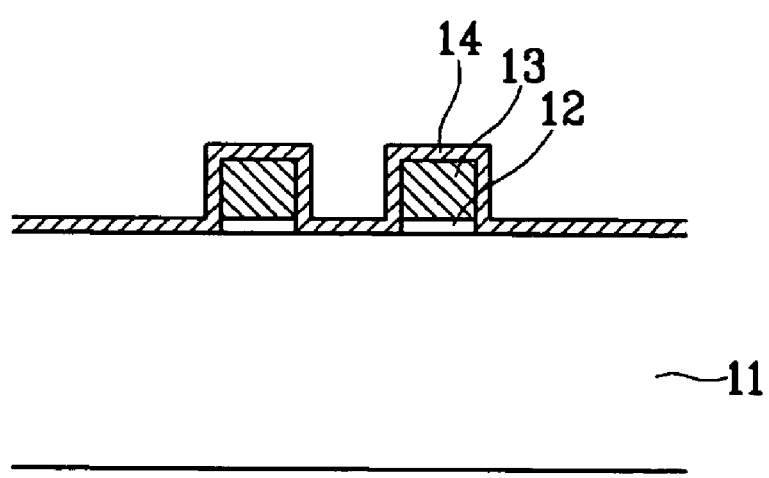
Figure 3D:
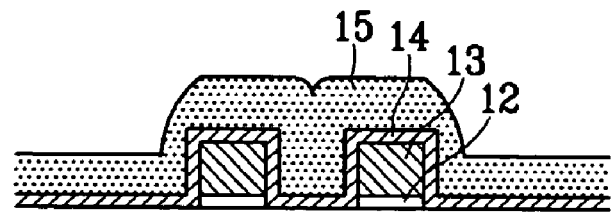
Figure 3E:
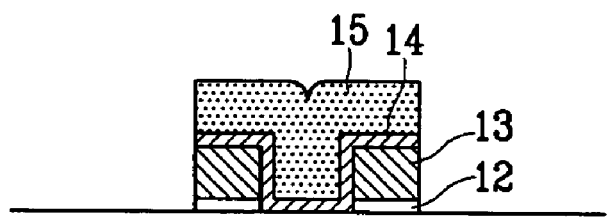
Figure 3F:
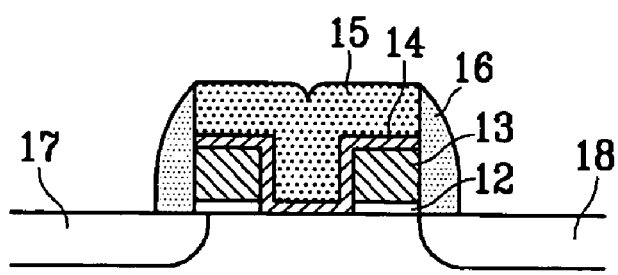
Figure 4A:
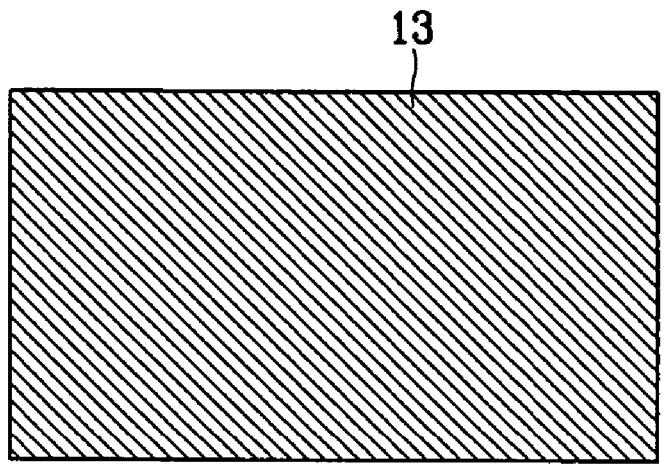
FIGS. 4a to 4f are top views of FIG. 3a to 3f.
Figure 4B:
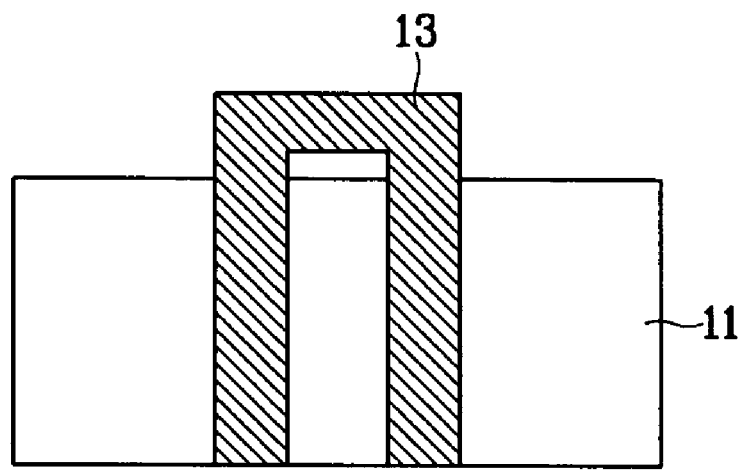
Figure 4C:
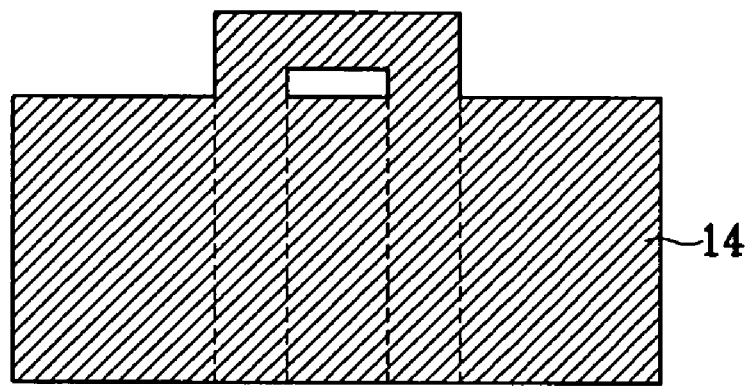
Figure 4D:
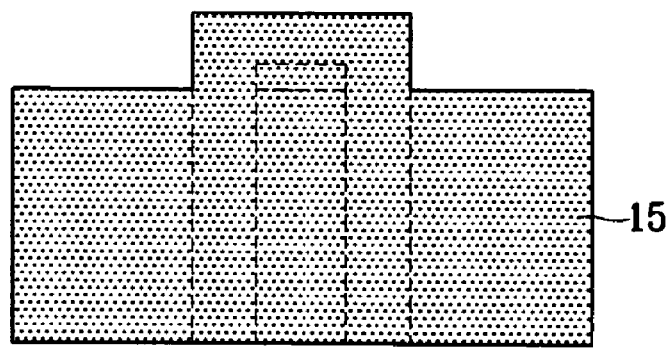
Figure 4E:
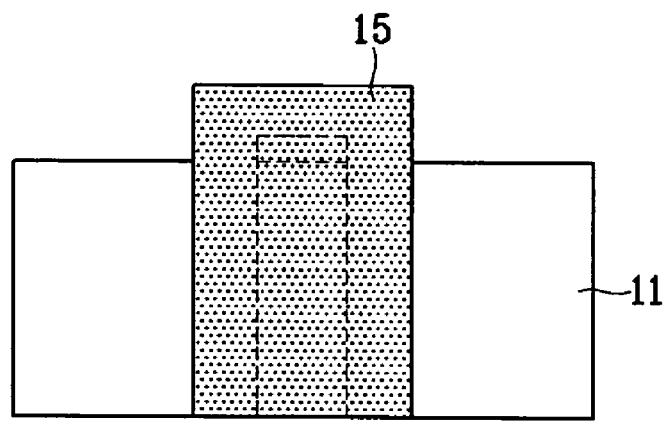
Figure 4F:
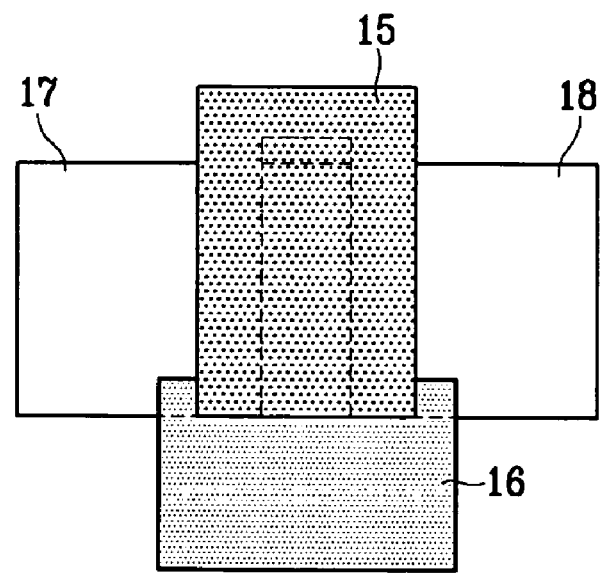

FIGS. 3f and 4f are respectively a sectional view and a top view showing a flash memory according to the present invention. As shown in the figures, in the flash memory according to the present invention, a tunneling oxide 12 is formed with a predetermined width only on a portion of a semiconductor substrate 11 in which injection of electrons occurs.

Namely, the tunneling oxide 12 consists of two regions two regions, each having a predetermined width on an active area of the semiconductor substrate 11, separated from each other by a predetermined interval, and connected to each other in a field area of the semiconductor substrate.

A floating gate 13 made of a polycrystalline silicon is formed on the tunneling oxide 12, a gate insulation film 14 is formed on a top surface of the semiconductor substrate 11 exposed between two regions of the tunneling oxide 12, a top surface of the floating gate, and an inner side of the floating gate 13, and a control gate 15 made of a polycrystalline silicon is formed on the gate insulation film 14.

A side wall 16 is formed on outer sides of the control gate 15, the gate insulation film 14, the floating gate 13, and the tunneling oxide 12, and a source 17 and a drain 18 are formed in the semiconductor substrate 11 outside the floating gate 13 to complete a flash memory.

Now, a method for fabricating the flash memory with the above-described structure according to the present invention will be in detail described with reference to the accompanying drawings.

FIGS. 3a to 3f are sectional views showing a method for fabricating the flash memory according to an embodiment of the present invention, and FIGS. 4a to 4f are top views of FIG. 3a to 3f.

First, as shown in FIG. 3a and FIG. 4a, the tunneling oxide 12 is thinly formed on the semiconductor substrate 11, and then the floating gate 13 is formed by depositing a polycrystalline silicon layer on the tunneling oxide 12.

At this time, the tunneling oxide 12 is formed at a thickness of an order of 50-150 Å, preferably, 100 Å. When an electric field is applied to a circuit, the tunneling oxide 12 functions as a passage through which electrons accelerated by the electric field are introduced into the floating gate, and, when the electric field is not applied, functions as a cut-off to prevent the electrons introduced into the floating gate 13 from returning to the semiconductor substrate 11.

When the floating gate 13 is formed, the polycrystalline silicon layer is formed at a thickness of an order of 2,000-3,000 Å, preferably, 2,500 Å. The floating gate 13 stores the introduced electrons, which means programming of data. On the contrary, release of the electrons from the floating gate 13 to the semiconductor substrate 11 depending on electric field conditions means erasure of data.

Next, as shown in FIGS. 3b and 4b, the floating gate 13 and the tunneling oxide 12 are selectively etched such that they are left only in a portion in which injection of the electrons occurs when a flash memory cell is activated.

At this time, the floating gate 13 on the portion in which the injection of the electrons for programming occurs and the floating gate 13 on the portion in which the injection of the electrons for erasure occurs are separated from each other in an active area where the flash memory cell is activated, and these separated floating gates 13 are connected to each other in a field area.

Next, as shown in FIGS. 3c and 4c, the gate insulation film 14 having the ONO structure is formed on the entire top surface of the semiconductor substrate 11 including the floating gate 13.

In order to form the gate insulation film 14 having the ONO structure, a lower oxide film is formed on the floating gate 13 by thermally oxidizing the polycrystalline silicon layer of the floating gate, a silicon nitride film is formed on the lower oxide film by using a thermal process, and then an upper oxide film is formed on the silicon nitride film by using a thermal process and is annealed.

In the gate insulation film 14 having the ONO structure, the lower and upper oxide films prevent the electrons introduced into the floating gate 13 from moving to the control gate, and the silicon nitride film facilitates polarization of the floating gate by a voltage applied to the control gate.

Next, as shown in FIGS. 3d and 4d, the control gate 15 functioning as an actual electrode is formed by depositing a polycrystalline silicon layer on the gate insulation film 14.

When the control gate 15 is formed, the polycrystalline silicon layer is formed at a thickness of an order of 2,000-3,000 Å, preferably, 2,500 Å.

Next, as shown in FIGS. 3e and 4e, after the control gate 15, the gate insulation film 14, the floating gate 13, and the tunneling oxide 12 are selectively etched, leaving a predetermined width, and the semiconductor substrate 11 is exposed in remaining regions except for the predetermined width.

At this time, the gate insulation film 14 is completely removed such that it does not remain in a lateral wall exposed of the floating gate 13.

Next, as shown in FIGS. 3f and 4f, a silicon nitride film is deposited on the entire top surface including the control gate 15, and a side wall 16 is formed by blanket etch without using a separate mask.

At this time, the silicon nitride film is formed at a thickness of an order of 1,500-2,500 Å, preferably, 2,000 Å.

Subsequently, the source 17 and the drain 18 are formed by injecting impurity ions into the semiconductor substrate 11.

When a positive voltage of certain conditions for programming of data in the flash memory fabricated as described above is applied to the gate, hot electrons are injected into the floating gate 13 as they move through a channel formed in the semiconductor substrate 11 under the tunneling oxide 12 and are accelerated by an electric field.

At this time, the hot electrons are injected into the floating gate located at a point close to a drain 18, which shows the greatest potential difference.

Similarly, when a negative voltage of certain conditions for erasure of data is applied to the gate, the electrons stored in the floating gate 13 are injected into the source 17 by a potential difference.

At this time, the electrons are injected from the floating gate 13 located at a point close to the source 17, which shows the greatest potential difference, into the source 17 through the tunneling oxide 12 under the floating gate 13.

As described above, in the flash memory according to the present invention, since the tunneling oxide 12 and the floating gate 13 are formed only in a portion where injection of electrons occurs and the gate insulation film 14 is formed on the semiconductor substrate between two portions of the tunneling oxide, the whole capacitance of the flash memory cell is increased.

Accordingly, an application voltage, which had to be increased in order to compensate for a reduced capacitance in the conventional method, can be decreased and hence power consumption can be decreased.

In addition, heat, which was generated due to the increase of the application voltage in the conventional method, can be suppressed, which results in extension of life of devices.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for fabricating a flash memory, comprising the steps of:

forming a tunneling oxide layer on a semiconductor substrate;

forming a floating gate by depositing a first polycrystalline silicon layer on the tunneling oxide layer;

selectively etching the floating gate and the tunneling oxide layer to form two regions, wherein the two regions have a predetermined width on an active area of the semiconductor substrate, are separated from each other by a predetermined interval, and are connected to each other in a field area of the semiconductor substrate;

forming a gate insulation film on the entire surface of the semiconductor substrate including the floating gate;

forming a control gate by depositing a second polycrystalline silicon layer on the gate insulation film;

exposing an outside wall of the floating gate by etching the gate insulation film formed on the outside wall of the floating gate while selectively etching the control gate and the gate insulation film such that the control gate and the gate insulation film to have a predetermined width;

forming a nitride film on the entire top surface of the semiconductor substrate and then forming a side wall on outside walls of the control gate, the gate insulation film, the floating gate, and the tunneling oxide by blanket-etching the nitride film, wherein the side wall is formed to have a height which is not greater than a height of the control gate; and forming a source and drain region by injecting impurities into the semiconductor to the outside of the floating gate.

2. The method of claim 1 wherein, the first polycrystalline silicon and the second polycrystalline silicon are formed to have a thickness of about 2,000-3,000 Å.

3. The method of claim 1 wherein, forming the gate insulation film comprises forming the gate insulation film to be a three-layered structure of lower oxide film-nitride film-upper oxide film (ONO) by forming a lower oxide film on the floating gate by thermally oxidizing the first polycrystalline silicon layer constituting the floating gate, forming a silicon nitride film on the lower oxide film by using a thermal process, and then forming and annealing an upper oxide film on the silicon nitride film by using a thermal process.

4. The method of claim 2 wherein, forming the gate insulation film comprises forming the gate insulation film to be a three-layered structure of lower oxide film-nitride film-upper oxide film (ONO) by forming a lower oxide film on the floating gate by thermally oxidizing the first polycrystalline silicon layer constituting the floating gate, forming a silicon nitride film on the lower oxide film by using a thermal process, and then forming and annealing an upper oxide film on the silicon nitride film by using a thermal process.

* * * * *